United States Patent [19]

Morino et al.

[11] Patent Number: 4,818,322

[45] Date of Patent: Apr. 4, 1989

[54] METHOD FOR SCRIBING CONDUCTORS VIA LASER

[75] Inventors: Ronald Morino, Sea Cliff; Brian E. Swiggett; Raymond J. Keogh, both of Huntington, all of N.Y.; Jonathan C. Crowell, Lakeville, Mass.

[73] Assignee: Kollmorgen Technologies Corporation, Dallas, Tex.

[21] Appl. No.: 96,873

[22] Filed: Sep. 14, 1987

Related U.S. Application Data

[63] Continuation of Ser. No. 756,691, Jul. 19, 1985, abandoned.

[51] Int. Cl.$^4$ .................... B23K 26/02; B23K 26/08; B32B 31/28
[52] U.S. Cl. .................................. 156/272.8; 29/829; 29/850; 156/275.7; 156/324.4; 219/121.64; 219/121.66
[58] Field of Search .................. 204/157.15, 157.41; 156/359, 166, 272.8, 275.1, 275.3, 308.2, 308.4, 309.6, 324.4, 82, 257, 258, 267, 273.5, 273.7, 275.7; 219/121 LA, 121 LG, 121 LD, 121 LE, 121 LF, 121 LS, 121 LT, 121 LW, 121 LY, 121 LM; 29/825, 829, 830, 846, 847, 850

[56] References Cited

U.S. PATENT DOCUMENTS

| | | | |
|---|---|---|---|
| 3,674,602 | 7/1972 | Keogh et al. | 156/350 |
| 3,674,914 | 7/1972 | Burr | 174/68.5 |
| 3,974,016 | 8/1976 | Bondybey | 219/121 LA |
| 4,029,535 | 6/1977 | Cannon | 219/121 LA |
| 4,327,124 | 4/1982 | Des Marais | 427/96 |
| 4,414,741 | 11/1983 | Holt | 29/837 |
| 4,450,623 | 5/1984 | Burr | 29/850 |
| 4,500,389 | 2/1985 | Lassen | 156/643 |
| 4,539,059 | 9/1985 | Burger | 156/272.8 |
| 4,588,468 | 5/1986 | McGuinty et al. | 156/345 |

FOREIGN PATENT DOCUMENTS

| | | | |
|---|---|---|---|
| 1102924 | 6/1981 | Canada | 156/73.5 |
| 113820A2 | 7/1984 | European Pat. Off. | |
| 1504252 | 3/1978 | United Kingdom | |

Primary Examiner—Merrell C. Cashion, Jr.
Attorney, Agent, or Firm—Morgan & Finnegan

[57] ABSTRACT

This invention relates to a method of using laser energy for bonding and stripping conductors during the scribing operation. The method provides and directs discrete laser beam pulses of substantially the same energy content at a rate which continuously varies as the conductor feed rate continuously varies to provide a constant number of discrete pulses for each incremental length of conductor being scribed.

18 Claims, 4 Drawing Sheets

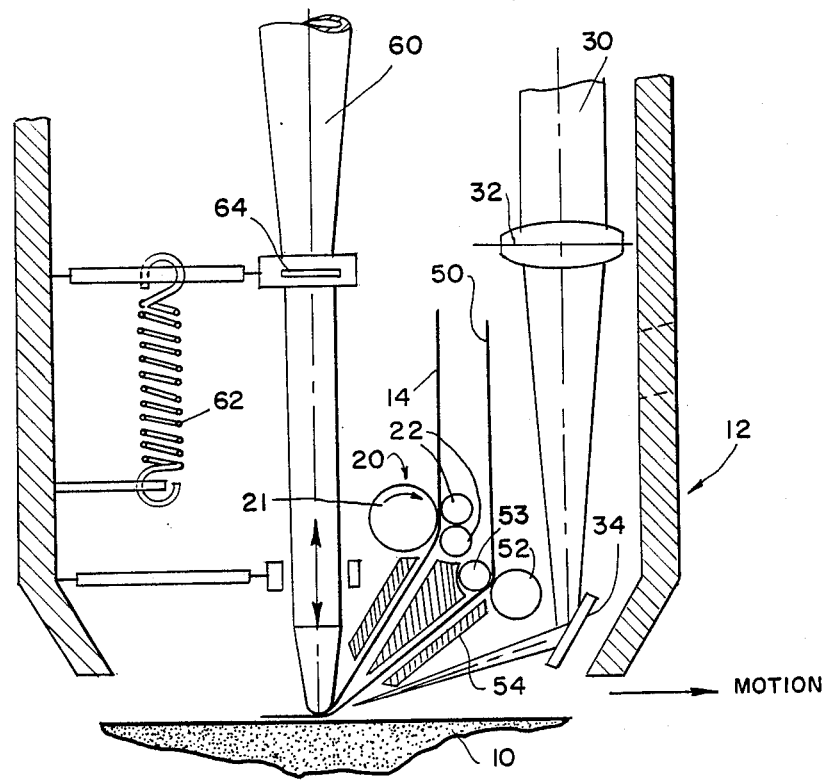
FIG. 3
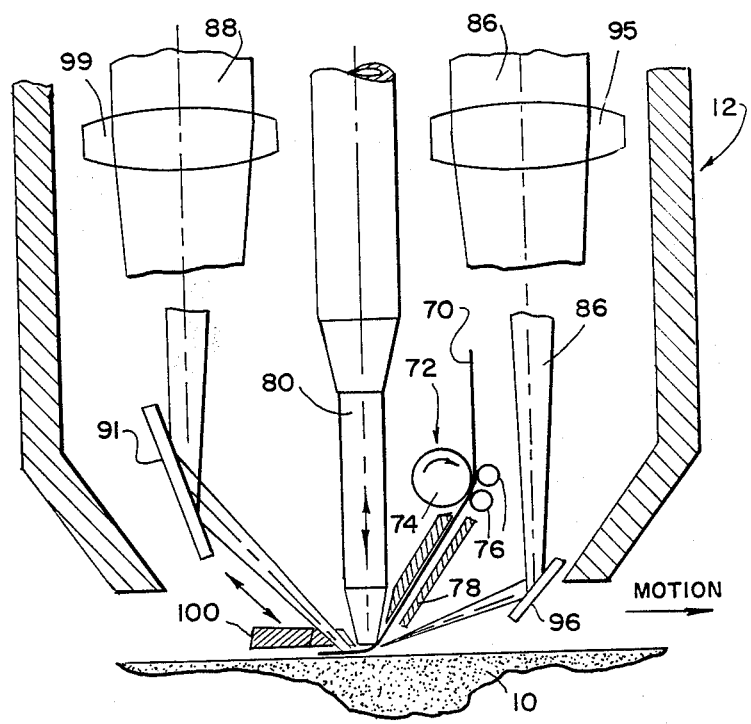
FIG. 4C
FIG. 4B

METHOD FOR SCRIBING CONDUCTORS VIA LASER

This is a continuation of co-pending application Ser. No. 756,691, filed July 19, 1985, now abandoned.

BACKGROUND OF THE INVENTION

This invention relates to the manufacture of wire-scribed interconnection circuit boards. More particularly, this invention relates to the use of laser energy for bonding and stripping conductors during the scribing process.

U.S. Pat. No. 3,674,914 to Burr, No. 3,674,602 to Keogh and Canadian Pat. No. 1,102,924 granted June 9, 1981 describe a process and apparatus for scribing conductors onto an insulating substrate which has been precoated with an adhesive layer by continuously feeding a fine insulated wire onto the surface of the substrate, affixing the conductors to the substrate and cutting the conductors at predetermined points. The process described in these patents is capable of producing a conductor image of a predetermined interconnect pattern.

The conductor pattern is formed by tacking the insulated wire to the adhesive layer by means of a scribing element which locally heats the adhesive layer. The adhesive melts, is formed to at least partially surround the conductor and then, upon cooling, creates a bond between the conductor and the substrate. The adhesive material thus captures the conductor and forms a combined mechanical and chemical bond.

European Patent Application No. 110,820 published July 25, 1984 describes an apparatus for scribing wire into an activated layer of photocurable adhesive. The adhesive is activated using ultrasonic energy and subsequently cured by means of optical energy which may be laser energy.

Japanese Laid-Open Application No. 57-136,391, published Aug. 23, 1982, describes a process wherein wires are scribed in a predetermined pattern onto an adhesive-coated surface of a substrate. Laser energy in combination with ultrasonic energy is used to soften the adhesive and press the wire into the adhesive as the wire is being scribed.

There are, however, many problems and obstacles faced in using a laser beam as an energy source to activate an adhesive used in the scribing process, whether the adhesive is located on the surface to be scribed or on the conductor. Directing laser energy to the adhesive as a continuous beam achieves a consistent level of activation along the predetermined conductor pattern only if the laser beam is moved along the adhesive at a constant velocity or modulated according to complex control variables. The energy received by a particular section of the adhesive increases as the duration of its exposure to the energy increases. The duration of exposure is inversely proportional to the velocity at which the laser beam moves along the predetermined pattern on the adhesive. Thus, if the speed at which a conductor is scribed changes (also referred to as scribing speed), the exposure time of the adhesive in different area also varies. During the scribing process, the scribing element can change the scribing speed under at least three circumstances: when the scribing element accelerates from a stop to a predetermined running speed; when an inflection or turn is made (requiring the scribing element to decelerate before making a turn, to stop in order to make the inflection, and to accelerate to the running speed after making the turn); and when the scribing element decelerates to a stop at the end of a conductor run. As a result, when the speed of the scribing element is lower than the running speed, the adhesive may receive excess energy causing the adhesive or surrounding materials to be scorched or damaged. If the level of laser energy is lowered to compensate for the excess energy at lower speeds, the amount of energy received by other sections of adhesive at running speed may be insufficient to activate the adhesive.

It is, therefore, an object of this invention to provide method and apparatus for scribing conductors in a predetermined pattern onto a substrate using a precisely-controlled laser beam or beams to activate the adhesive used to bond the conductors to the substrate.

It is a further object of this invention to provide a method of constructing a wire-scribed circuit board wherein the the bonding adhesive activation is controlled in a simple manner.

It is yet a further object to provide method and apparatus for effective adhesive bonding and wire stripping of scribed conductors using one or more laser beams.

DEFINITIONS

A "substrate" is the insulating material on which a conductor pattern is formed.

A "conductor" is at least one preformed, elongated filament having at least one portion, a "conductive portion", capable of conducting energy, such as electrical energy or light energy. Conductors may be coated with an insulation layer.

"Scribing" is the process of applying and affixing conductors to a substrate in a predetermined pattern.

"Laser energy" is the amount of energy emitted from a laser energy source and is the product of power and time.

An "adhesive" as referred to herein is the material used to bond a conductor to a surface of a substrate. The adhesive may be coating encapsulating a conductor, may be placed on the surface of the substrate or may be supplied separately as a film.

To "activate" refers to the process of rendering the adhesive tacky and capable of forming a bond.

SUMMARY OF THE INVENTION

It has been found that a laser beam may be used to activate adhesives in a process for scribing conductors in an easily-controlled manner by a series of discreet laser beam pulses directed toward the adhesive. The pulses are preset to contain uniform quanta of energy according to conditions such as laser beam cross section (hereinafter referred to as focus, source efficiency, adhesive activation requirements and the like. A pulse is emitted each time a predetermined incremental portion of the conductor is scribed along the conductor path. In this way, each unit length, and thus unit area, along the conductor path receives substantially the same amount of energy regardless of the scribing speed. The method of this invention thus provides an accurate, consistent and simple means for activating adhesive and scribing conductors to form an interconnection pattern. The laser energy can also be used to achieve insulation stripping, soldering and cutting of conductors at the terminal points.

BRIEF DESCRIPTION OF THE DRAWINGS

FIG. 3 is a cross-sectional view of a scribing head according to another embodiment of the invention wherein the adhesive is supplied separately.

FIGS. 4A, 4B and 4C are cross-sectional views at different magnifications illustrating a dual laser beam embodiment where an adhesive is supplied coated on the wire.

DETAILED DESCRIPTION OF THE PREFERRED EMBODIMENTS

Figure 1:
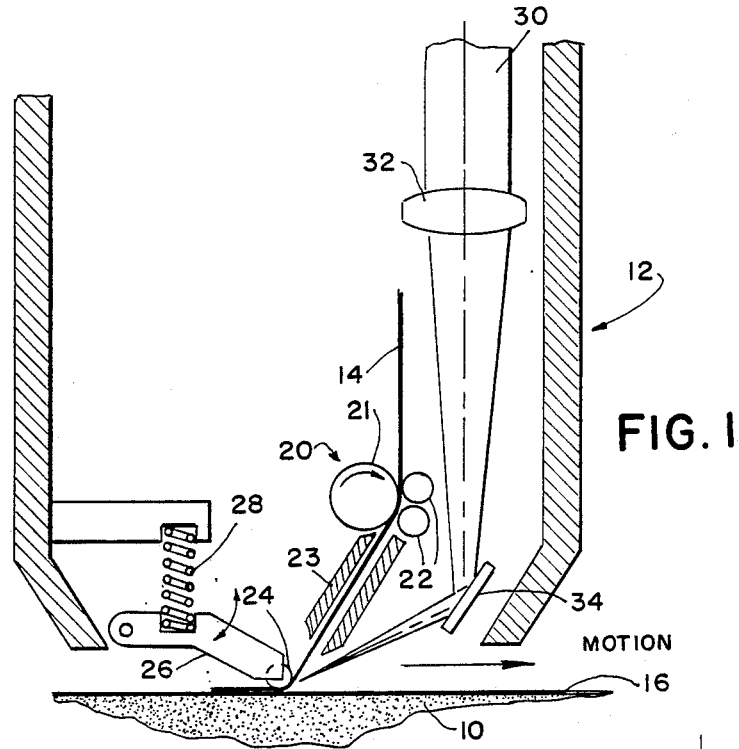
FIG. 1 is a cross-sectional view of a scribing head for laser bonding insulated wire to an adhesive coated substrate.

FIG. 1 shows a scribing head suitable for a laser bonding of scribed conductors where the adhesive is applied to the surface of the substrate. The substrate 10 can be of any suitable circuit board material and is preferably mounted on an X-Y table for controlled movement. Preferably the table positioning is digitally controlled in accordance with a computer program. The scribing head 12 dispenses insulated wire 14 and is rotatable so that the wire is dispensed in the direction of the table movement. In a typical sequence the table moves in one direction while scribing a wire of a predetermined conductor length, then the table stops to permit head rotation to provide a turn or inflection in the conductor run, then the table moves in a new direction indicated by the head position. In this fashion a conductor path is provided on the substrate surface.

In this embodiment the adhesive layer 16 used for bonding the insulated wire to the substrate is precoated on the substrate surface.

Insulated wire is supplied via a wire feed 20 including a drive roller 21 and a pair of idler rollers 22. The drive rollers are preferably controlled so that the wire is fed at a rate coinciding with the rate at which the substrate is moved by the table. The wire passes from the wire feed through a wire guide 23 to the adhesive coated surface of the substrate. The wire is pushed downwardly into the adhesive by a grooved guide roller 24. The roller is mounted at the free end of a pivotable arm 26 urged downwardly by means of a spring 28.

A laser beam 30 is focussed by a lens 32 and reflected off a mirror 34 to the adhesive surface at, or slightly ahead of, the contact point between the insulated wire and the adhesive surface. The laser beam is in the form of fixed energy pulses supplied in accordance with the incremental displacements of the table so as to activate the adhesive beneath the wire as the wire is being scribed. The roller pushes the wire into the soft activated adhesive. Thereafter, the adhesive rapidly solidifies forming a secure bond between the wire and the substrate.

Figure 2B:
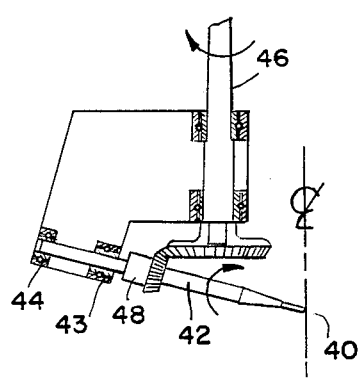
FIGS. 2A and 2B are cross-sectional views of a scribing head similar to FIG. 1 intended for use with finer wires.
Figure 2A:
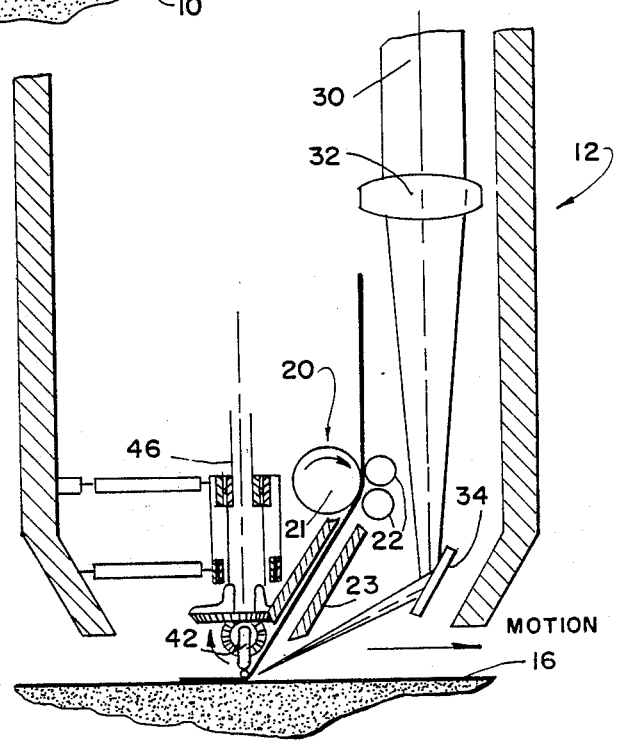

FIG. 2A illustrates another embodiment wherein a miniature grooved roller 40 is used in place of roller 24. In circuit boards where conductors cross over parallel conductors, a small embedding roller is desired so that the wire being scribed can be pushed into contact with the substrate surface between the parallel conductors. With fine wires (for example, 42 AWG wire with 0.0025" diameter) the embedding wheel should be on the order of 0.015 to 0.030" radius. As is best seen in FIG. 2b the miniature grooved roller 40 is machined into the end of a rod 42 which is maintained in position by bearings 43 and 44 located at the other end of the rod. The rod is urged downwardly by means of a freely rotating bevelled gear 46 which engages a bevelled gear 48 mounted on rod 42.

FIG. 3 illustrates another embodiment wherein the adhesive is supplied separately and wherein the wire is pressed into the adhesive by an ultrasonic stylus. The adhesive film 50 passes between a drive roller 52 and idler roller 53 so that the film advances simultaneously with the wire 14. The adhesive film is slightly wider than the wire. Film 50, as it emerges from feed rollers 52 and 53, passes through a guide 54 and is laid down on the substrate beneath the insulated wire. Laser beam 30 is directed by mirror 34 to activate the adhesive just prior to the contact with the substrate surface.

Stylus 60 is energized by ultrasonic vibration and is grooved at the end to provide a wire guide to position the wire on the substrate surface. The ultrasonic stylus is shaped to provide a relatively small frictionless wire guide and presses the wire into the activated adhesive. The ultrasonic energy is preferably maintained at a low amplitude level sufficient to provide the frictionless guide and to tamp the wire into place. The stylus does not contribute significantly to the energy supplied for activating the adhesive. At the low energy levels, the ultrasonic energy is found usable without creating significant cold working or breaking of the insulated wire. The downward force of the stylus is supplied by spring 62 which is attached to the stationary node point 64 of the stylus.

Figure 4A:
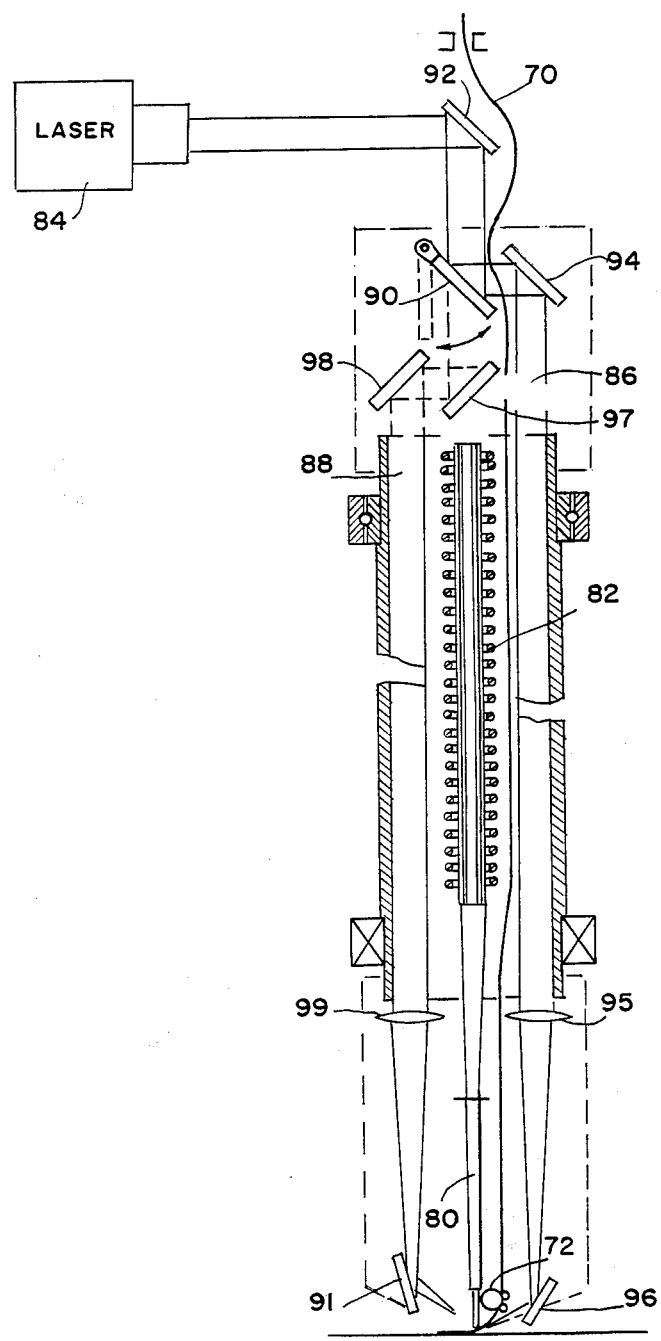

FIGS. 4A, 4B and 4C illustrate a dual beam embodiment for cutting, stripping, and soldering as well as adhesive activation. In this embodiment the adhesive is precoated onto the insulated wire.

The coated wire 70 is supplied via a wire feed 72 including a drive roller 74 and a pair of idler rollers 76. Thereafter the wire passes through a wire guide 78 and beneath a grooved ultrasonic stylus 80. The stylus is generally shaped as shown in FIG. 4A and is energized by magnetostriction as a result of high frequency energy supplied to a coil 82 surrounding the stylus. When energized, the working end of the stylus vibrates up and down.

A laser 84 provides laser energy in controlled pulses via either of two beams 86 and 88. As determined by a pivotal mirror 90. With mirror 90 in the solid line position, the laser energy is reflected off mirrors 92, 90, 94, passes through lens 95 and is then reflected off mirror 96 to the underside of the coated wire at the point of contact with substrate 10. When mirror 90 is in the dotted line position, the laser energy is reflected off mirrors 92, 97, 98, passes through lens 99 and is then reflected off mirror 91, to the upper side of the insulated wire being scribed. The laser energy reflected off mirror 91 as can be seen in FIGS. 4B and 4C passes through an aperture in a wire clamp 100 which holds the wire in place during stripping, cutting and soldering operations.

In a typical operating sequence, the wire end is pushed into position under clamp 100 by wire feed 72 and then sufficient energy is supplied via pulsed laser beam 88 to vaporize the insulation on the conductor. Sufficient energy can also be supplied to solder or weld the conductor to a terminal pad 102 on the substrate surface. The X-Y table then moves the substrate in a direction indicated by the scribing head to provide a straight conductor run. Laser energy from beam 86 activates the adhesive prior to contact with the substrate and stylus 80 presses the wire into contact with the substrate surface. As the adhesive cools a bond is formed between the insulated wire and the substrate. If turns or inflection points are required in the conductor run, the table movement stops, scribing head 12 rotates to a new direction to provide the turn or inflection in the conductor, and the table then moves in a new direction indicated by the scribing head position. At the end of the conductor run laser energy is supplied via beam 88 to again strip insulation off the conductor and to solder or weld the conductor to a terminal pad on the substrate. Thereafter, the table can be moved slightly so that beam 88 is focussed on the conductor just beyond the terminal pad and sufficient energy at the proper wavelength is supplied to cut through the conductor.

Figure 5:
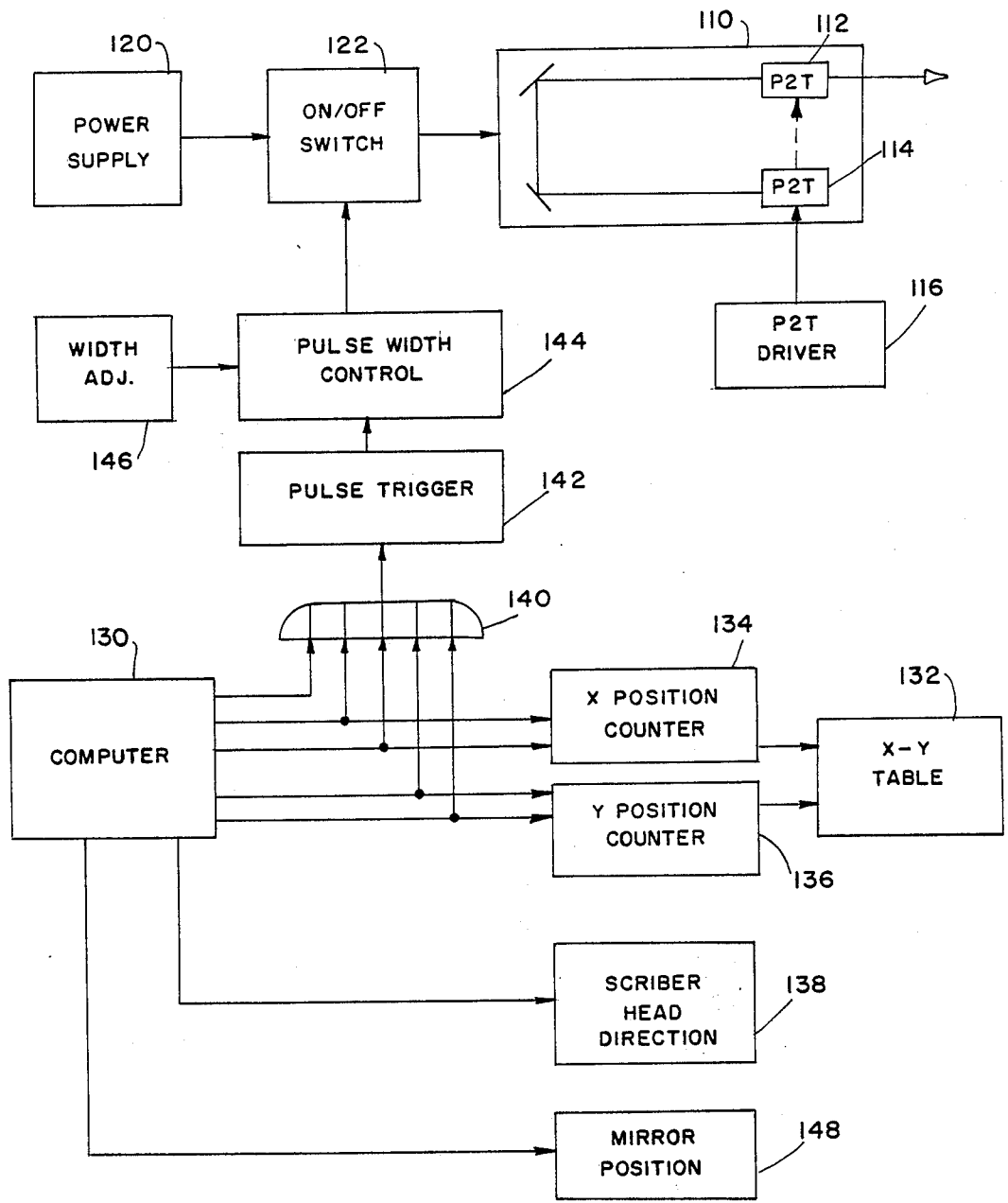
FIG. 5 is a schematic block diagram illustrating the control circuit for the laser.

FIG. 5 is a schematic block diagram illustrating a control system suitable for providing the laser beams referred to in FIGS. 1–4. The laser is preferably a $CO_2$ laser 110 powered by a laser powered supply 120 via an on/off control switch 122. A laser is of a folded waveguide design with piezo electric transducers 112 and 114 at the ends of the waveguide for adjustment of the dimensions of the laser cavity. PZT driver circuit 116 controls the piezo electric transducers to in turn control the laser frequency. When switch 122 is on, power supply 120 maintains current flow through the $CO_2$ gas medium in the laser cavity. This current is the primary excitation for the gas which, in turn, produces the laser beam.

The $CO_2$ laser produce laser energy at a wavelength of 10.6 microns which is in the heat spectrum ideal for activating adhesives, stripping insulation in the conductor, is largely reflective at this wavelength and virtually unaffected by this laser energy.

A computer 130 is utilized to control the position of the X-Y table 132 as well as the direction of the scribing head via circuit 138. The X position of the table is in accordance with the count in an X position counter 134 and the Y position of table 132 is in accordance with the count in a Y position counter 136. Pulses are supplied by computer 130 to the respective "UP" and "DN" inputs of the respective counters to increase or decrease the counts therein. Each incremental movement of table 132 is in response to a pulse from computer 130. These pulses are also supplied to four separate inputs of a five input OR gate 140.

The output of the OR gate is supplied to a pulse trigger circuit 142 which in turn controls on/off switch 122 via a pulse width control circuit 144. Each pulse from trigger circuit 142 turns the laser on for a predetermined period of time as controlled by pulse width circuit 144. The pulse width can be adjusted by circuit 146 so that the pulse energy content is adjustable according to ambient conditions.

In the dual beam embodiment (FIG. 4) mirror 90 directs the laser energy into either beam 86 for adhesive activation or into beam 88 for stripping, soldering, and cutting. The mirror position is controlled by computer 130 via a mirror position circuit 148. During the wire scribing operation, mirror 90 is in the solid line position directing the laser energy pulses to the underside of the wire via beam 86.

For the stripping, cutting and soldering operations, circuit 148 positions mirror 90 in the dotted line position (FIG. 4) so that the laser energy is directed to the top side of the insulated wire via beam 88. Since the table is stationary during these operations the successive laser pulses heat the same target area on the conductor and hence, large quantities of laser energy can be supplied to the same point. A computer output 149 is supplied to OR gate 140 to provide the trigger pulses for these operations. When necessary, a pulse can periodically be supplied to counters 134 and 136 to provide a slow table movement during the stripping, or soldering operations.

For cutting operations laser energy at a shorter wavelength is preferable to achieve greater energy absorption by the copper. A neodymium doped yttrium—aluminum—Garnet laser with a wavelength of 1.06 microns would be preferred selection for the cutting operation.

The laser beam used to activate the adhesive to scribe a conductor to the surface of a substrate must be carefully configured and controlled within certain spatial and time limits. Careful configuration and control allows the adhesive to receive sufficient energy to become activated for bonding the conductor. If the laser energy is not properly configured and controlled, inadequate bonding between the conductor and surface occurs due to gaps and inconsistencies in the bond formed. Excess energy, on the other hand, can damage the conductor or surrounding materials.

The process of this invention avoids these problems and achieves consistent activation of the adhesive along the entire length of the conductor. In order to achieve this goal, the total amount of energy received by a unit area of the adhesive should be constant, independent of the speed at which the impingement of the laser beam moves along the surface of the adhesive.

As previously mentioned, adhesive may be placed either on the surface of the substrate or coated onto the conductor itself, or supplied separately. The impingement of the laser beam moves on the adhesive with the scribing head along the conductor path. A fixed quantum of energy is emitted in pulse form and received by a predetermined area of the adhesive when a fixed length of the conductor path is traversed by the scribing head and the impinging laser beam. After the adhesive has been activated, the conductor is placed on the substrate surface. As the adhesive loses energy received from the laser beam, it reverts to a non-tacky state, and forms a bond between the conductor and the surface of the substrate to which the conductor has been scribed. The pulsed laser beam is directed toward the adhesive either on the wire or on the surface and its locus of impingement moves along the surface just prior to or simultaneously with the scribing head placing the conductor in contact with the substrate.

The laser beam pulses all have substantially equal amounts of energy. The energy of the pulse is the product of the pulse amplitude, or power level of the pulse, and the pulse width, or duration of the pulse. Each pulse should have at least enough energy to render the area on which it impinges tacky for the time period required to scribe that area of the conductor to the surface of the substrate. The pulse energy should be below the value which causes C-stage curing of the adhesive or damage to surrounding areas. The energy of the pulses is set prior to the start of the scribing process.

A pulse of laser energy is emitted each time an incremental distance is transversed along the adhesive. The number of pulses emitted per unit time, or the "pulse repetition rate", therefore, necessarily varies as the distance traversed per unit time. In other words, it varies as a function of the scribing speed.

Thus, according to the method of this invention, regardless of variations in the scribing speed, the amount of energy received by each unit area of the adhesive remains constant. This results in uniform, consistent bonding along the entire length of the conductor being scribed.

The scribing element momentarily maintains the desired conductor position of the surface, but as the scribing head moves on, its ability to control the conductor position is lost. The adhesive therefore should quickly form a bond between the conductor and the substrate surface to maintain the desired position.

Preferably, the adhesive, after activation, should revert to a non-tacky state to form the bond within about 50 to about 200 milliseconds in order to maintain the desired conductor position. One advantage of using a controlled predetermined energy pulse just sufficient to activate the adhesive is that the time the adhesive takes to heat, activate, and lose the heat energy, (the "thermal cycle") is considerably reduced. By matching the amount of energy emitted to the amount of energy required to activate the adhesive, the duration of the thermal cycle is reduced and the required bond is formed more quickly than if excess energy is applied.

Preferably, the laser pulse energy level is preset to the minimum energy needed to activate the particular adhesive used in scribing a conductor. To determine this setting, the adhesive to be used in the scribing process is baked and the temperature increase required to render the adhesive tacky is measured. Then, a laser beam is pulsed for the shortest duration possible at a particular area of the adhesive and the temperature increase of that area measured. The pulse energy level is adjusted to find the level which reliably raises the temperature to a degree sufficient to render the adhesive tacky.

The distance between pulses impinging along the scribed conductor can also be set prior to scribing. The distance should be sufficiently small to afford continuous bonding along the length of conductor. The extent of continuous bonding can be determined by microscopic examination of the scribed conductor. If gaps or ripples appear, sections of the adhesive have not been activated. Such discontinuities can be corrected by adjusting the laser beam "spot size" and the pulse energy level.

The spot size is preferably as small as possible. If the spot size is too small, a slight misalignment may cause the laser beam to miss the conductor and the adhesive thereon. Preferably, the spot size diameter is approximately four to five times as large as the conductor diameter. The spot size should be limited to avoid heating the apparatus surrounding the scribing area, potentially causing damage and malfunctions.

The energy distribution in a spot can be varied, but preferred is the one-lobe Gaussian distribution in which the greatest amount of energy is concentrated at the center of the spot and the concentration decreases towards the periphery. In order to maintain a consistent level of activation along the conductor, the laser pulses should be spaced so that the spots overlap. The extent of the overlap depends upon the distribution of the pulse energy. The more diffuse the energy distribution, the greater the overlap should be. Preferably, the spots should overlap to an extent approximately 10 to about 90 percent of the diameter of the spot. More preferably, they should overlap by about 80% of the diameter of the spot.

When scribing conductors to a surface coated with a layer of adhesive, a pulsed $CO_2$ laser is preferably used. The pulse amplitude is preferably from about 5 to about 10 watts. The pulse width is from about 50 to about 2000 microseconds. The distance between pulses is preferably from about 0.002 to about 0.010 inches. The diameter of the spot is preferably between about 0.007 and about 0.030 inch. The scribing speed can range from 0 to about 15 inches per second. However, the scribing speed can be higher, depending upon the upper limits of the scribing apparatus. Of course, the preferred ranges of these parameters may vary depending upon the adhesive used.

Any adhesive capable of being rendered tacky and adherent by a laser beam pulse and which then forms a bond between the conductor and surface may be used for scribing conductors in accordance with the method of this invention. The adhesive may be a thermoplastic or a thermosetting resin and is preferably both thermoplastic and thermosetting.

The power level of the laser beam may fluctuate during use since the signal output of a sealed laser decays over time as it is used. Further, there may be momentary variations in the signal during a single scribing procedure. The method of this invention provides a convenient means to compensate for brief fluctuations in power output.

The power level of a sealed laser beam should be sampled over time. As the power output decays, the energy reaching the adhesive decreases. In accordance with this invention, the energy reaching the adhesive can be increased simply by increasing pulse width or amplitude or by decreasing the distance between pulses, [increasing the overlap of pulses impinging on the adhesive], which is tantamount to increasing the pulse repetition rate.

If an unsealed laser is used, the average power output can be measured by diverting a small fraction of the beam (approximately 5 to 10%) and measuring its power level. As the power level of the diverted beam changes, the power level of the major portion of the beam is changed accordingly, e.g., the pulse width can be varied to compensate for power fluctuations.

The scribing speed varies between 0 and 10 in/sec and is usually limited by the operating speed of the wire feed. Acceptable bonding, however, can be achieved at speed in excess of 15 in/sec.

EXAMPLE I

A conductive pattern for power and ground connections of an interconnection board was etched into the copper surfaces of a copper-clad epoxy-glass laminate substrate, known in the interconnection industry as an "FR-4" board.

An insulated conductor having a copper wire conductive portion and having an overall diameter of 1.5 millimeters (mm) was scribed onto the adhesive surface using a stylus as the scribing element. A $CO_2$ laser (commercially available as Everlase 150 TM from Coherent Corporation) was used to activate the adhesive during the scribing process. The available power output of Everlase 150 TM laser source was about 150 watts. The power output per pulse required for the adhesive used was between about 5 and 10 watts. The energy distribution mode of the beam was chosen to be the transverse electromagnetic mode TEM . . . , a one-lobe Gaussian curve mode.

An adhesive layer having the following solids composition was laminated over the epoxy-glass laminate under heat and pressure:

| Solids | |
| --- | --- |
| Acrylonitrite-butadiene copolymer rubber | 26.9% |
| Alkyl phenolic resole resin | 13.4% |
| Diglycidyl ether of Bisphenol Al, molecular weight approximately 1000 | 8.9% |
| Chlorosulfonate polyethylene rubber | 8.9% |
| Phenolic novolac resin containing hexamethyl triamine | 13.4% |
| Zirconium silicate (filler) | 17.9% |
| Palladium chloride liquid epoxy resin reaction product with 10% palladium | 2.6% |
| Fumed silica | 4.5% |
| Flow agent - vinyl silane | 0.9% |
| Copper phthalocyanine pigment | 2.6% |

Prior to lamination, the composition included 3-6% Cellosolve acetate, high flash naptha and methyl ethyl ketone as solvents.

The size of the beam output from the laser before the beam was transmitted through the optical system of the laser apparatus, the "raw beam diameter", was 10 mm. The raw beam was then transmitted through the optical system and focused onto the adhesive surface at an angle to form an oval-shaped spot approximately 0.5 mm wide and 0.75 mm long. The pulse width was chosen to be 100 microseconds. The distance between pulses was chosen to be 0.1 mm. The laser beam was directed to a point approximately 0.25 mm in front of the stylus such that during the scribing process the region of activated adhesive was 0.25 mm away from the stylus tip, the point at which conductor is dispensed. At a scribing speed of 125 mm/sec., uniform bonding to the substrate was achieved along the entire length of the conductor.

EXAMPLE 2

An elongated preformed wire conductor, for example, a copper wire of 38 awg (American Wire Gauge), or 0.1 mm diameter), plated with approximately 0.5 micometers of silver is covered with a layer of polyurethane insulation, 38 micrometers thick. The conductor is further provided with an adhesive coating having the following dry weight composition: 100 g high molecular weight polyurethane acrylate, 15 g epoxy acrylate, 9.8 g of a polyisocyanurate of toluene di-isocyanate, 3.5 g ultraviolet curing agent, and 0.5 g 4-methoxyphenol.

The corresponding wet weight composition, ready for coating, is as follows: 333.3 g high molecular weight polyurethane acrylate (32% solution), 15 g epoxy acrylate 19.6 g Polyisocyanurate (50% solution), 3.5 g ultraviolet curing agent, 0.5 g 4-methoxyphenol and toluene in the amount of 7 weight percent of the total.

A Laakman Electro-Optics, Inc. Model RF 165 laser is used as the laser energy source. The model RF 165 is a sealed $CO_2$ laser having a radio frequency-excited waveguide, a power output of 20 watts CW (continuous wave), a Gaussian (TEM . . . ) beam shape and a maximum modulation frequency of 10 KHZ.

The laser energy is discharged toward the wire conductor in the form of a pulsed beam. The pulse width of the beam is about 200 microseconds. The spot is approximately circular and has a diameter of about 1 mm (0.040 inches). The beam is pulsed when the conductor has been scribed about 0.2 mm (0.008 inches). The scribing speed is about 5 meters (200 inches) per minute. The spot size and pulse frequency are adjusted so that each section of conductor receives about five laser pulses. The activated adhesive coating loses energy, becomes non-tacky and forms a bond with the surface within about 200 milliseconds.

When all conductors of the predetermined pattern have been scribed to the board, the adhesive coating is fully cured by exposure to ultraviolet light.

We claim:

1. In a process for scribing a conductor in a predetermined pattern on a surface of a substrate, the process including the steps of: (a) providing a conductor; (b) scribing said conductor to the surface of the substrate; (c) bonding said conductor to the surface by means of an adhesive which is activated by directing laser energy at the adhesive, and scribing the conductor to the surface of the substrate, the improvement which comprises:
    (1) providing discrete laser beam pulses, each having substantially the same energy content,
    (2) directing said pulses substantially at the adhesive between the conductor and the substrate to activate the adhesive as the conductor is being scribed, and
    (3) continuously varying the number of said discrete pulses as the conductor feed rate continuously varies to provide a constant number of said discrete pulses for each incremental length of conductor being scribed.

2. A process according to claim 1 wherein said pulse energy content is adjustable prior to scribing and constant during the scribing operation.

3. A process according to claim 1 wherein the rate of pulses is timed such that the areas covered by successive pulses overlap.

4. A process according to claim 3 wherein the areas overlap from 10 to 90 percent of the beam diameter.

5. A process according to claim 4 wherein the areas overlap about 80% of the beam diameter.

6. A process according to claim 1 wherein the adhesive is applied to the substrate surface prior to the scribing operation.

7. A process according to claim 1 wherein the adhesive is applied as a coating on the conductor prior to the scribing operation.

8. A process according to claim 1 wherein the adhesive is supplied separately during the scribing operation.

9. A process for scribing a conductor in a predetermined pattern on a surface of a substrate comprising:
    (a) providing at least one conductor, a substrate the surface of which is to be scribed, and an adhesive for bonding said conductor to said surface;
    (b) scribing the conductor on said surface of the substrate following a predetermined path;
    (c) activating said adhesive along said predetermined path by directing discrete laser beam pulses substantially uniform in energy content at said adhesive; and
    (d) timing said pulses such that a discrete pulse is emitted for each discrete increment of scribing motion.

10. A process according to claim 9 wherein the adhesive is applied to the substrate surface prior to the scribing operation.

11. A process according to claim 9 wherein the adhesive is applied as a coating on the conductor prior to the scribing operation.

12. A process according to claim 9 wherein the adhesive is supplied separately during the scribing operation.

13. A process according to claim 9 wherein the conductor is an insulated conductor and wherein at least the ends of the insulated conductor are stripped of insulation by directing a laser beam of sufficient energy and proper wavelength thereto.

14. A process according to claim 13 wherein said laser beam of sufficient energy and proper wavelength is a second laser beam.

15. A process according to claim 9 wherein the substrate includes solder terminal points and wherein at least one end of the conductor is stripped and soldered to said terminal point by directing a second laser beam thereto.

16. A process according to claim 9 wherein the conductor is scribed between two terminal points on the substrate and wherein the conductor is cut after reaching the second terminal point by directing a laser beam of sufficient energy and proper wavelength thereto.

17. A process according to claims 14 or 15 wherein said second laser beam provides pulsed laser energy with 100% overlap for at least part of the time.

18. A process according to claim 16 where said laser beam employed for cutting has a different wavelength and energy level.

* * * * *